United States Patent
Santurkar et al.

(10) Patent No.: US 8,330,501 B1
(45) Date of Patent: Dec. 11, 2012

(54) DUAL MODE RAIL-TO-RAIL BUFFER FOR LOW VOLTAGE MEMORY

(75) Inventors: Vikram Santurkar, Hyderabad (IN); Gautham S. Jami, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 129 days.

(21) Appl. No.: 12/907,218

(22) Filed: Oct. 19, 2010

(51) Int. Cl.
*H03K 5/22* (2006.01)
(52) U.S. Cl. .............. 327/70; 327/65; 330/253
(58) Field of Classification Search .......... 327/62, 327/65, 70; 330/253
See application file for complete search history.

(56) References Cited

U.S. PATENT DOCUMENTS

| | | | | |
|---|---|---|---|---|
| 5,142,244 A | * | 8/1992 | Glica et al. | 330/253 |
| 5,574,401 A | * | 11/1996 | Spitalny | 330/253 |
| 5,889,419 A | * | 3/1999 | Fischer et al. | 327/70 |
| 6,005,439 A | * | 12/1999 | Fong | 330/253 |
| 6,384,679 B1 | * | 5/2002 | Lorenz | 330/51 |
| 6,445,218 B1 | * | 9/2002 | Lee | 327/65 |
| 6,504,403 B2 | * | 1/2003 | Bangs et al. | 327/62 |
| 6,864,725 B2 | * | 3/2005 | Cowles et al. | 327/108 |
| 7,425,844 B1 | * | 9/2008 | Chung et al. | 326/68 |
| 7,459,944 B2 | * | 12/2008 | Cowles et al. | 327/108 |
| 7,924,067 B2 | * | 4/2011 | Cowles et al. | 327/108 |

* cited by examiner

*Primary Examiner* — Ryan Jager
(74) *Attorney, Agent, or Firm* — Kevin T. Cuenot

(57) ABSTRACT

A system for voltage buffering within an integrated circuit (IC). The system can include a first buffer having an input and an output. The first buffer can be configured to buffer a received maximum input voltage approximately equal to a positive voltage supply powering the system. The system can include a second buffer having an input and an output. The input of the first buffer can be coupled to the input of the second buffer. The output of the first buffer can be coupled to the output of the second buffer. The second buffer can be configured to buffer a received minimum input voltage approximately equal to a negative voltage supply powering the system. The system further can include a controller configured to selectively enable only the first buffer or the second buffer at any given time.

16 Claims, 3 Drawing Sheets

DUAL MODE RAIL-TO-RAIL BUFFER FOR LOW VOLTAGE MEMORY

FIELD OF THE INVENTION

One or more embodiments disclosed within this specification relate to integrated circuits (ICs). More particularly, one or more embodiments relate to voltage buffering within an IC.

BACKGROUND

The voltage range of voltage supplies powering integrated circuits (ICs) continues to decrease. When a voltage range of a signal generated within an IC remains constant as the voltage range of the voltage supply of the IC decreases, a voltage margin between the upper end of the voltage range of the signal and the positive supply rail of the IC and/or a voltage margin between the lower end of the voltage range of the signal and the negative supply rail of the IC decreases. As one or both of these voltage margins decrease, the voltage applied across an input device and/or an output device of a circuit processing the signal can decrease. Depending upon the device, sufficiently decreasing the voltage applied across an input device and/or an output device can render the device inoperable.

The problem of shrinking voltage margins can be compounded when a voltage margin must be maintained to discern between two distinct voltage levels within a signal even as the voltage range of an IC voltage supply decreases. In that case, sufficient voltage margins must be maintained to distinguish between the two distinct voltage levels of the signal as well as to retain sufficient voltage across input and/or output devices to assure the devices remain operable while processing the signal.

In illustration, typically within an IC memory, an address line is enabled during a data operation, e.g., a read or a write, that provides access to data stored at the enabled address location. Generally, the signals used to drive address lines are buffered in order to provide the drive capacity necessary to charge and discharge the large capacitive loads that appear upon the address lines. Often, the signal level used to drive the address line during a data operation varies depending upon whether the data operation is a read or a write. As such, in order to distinguish a voltage level of a read operation from a voltage level of a write operation, some discernable voltage margin must exist between the read voltage level and the write voltage level. As IC memories migrate to lower supply voltages, it is preferable to preserve the voltage margin that distinguishes the read voltage level from the write voltage level.

In order to preserve the voltage margin between the read voltage level and the write voltage level in the face of decreasing IC voltage supplies, the voltage margin between the read voltage level and one rail of the voltage supply and/or the voltage margin between write voltage level and the other rail of the voltage supply must decrease. Accordingly, the voltage applied across an input device and/or an output device of the address line buffer can decrease. Thus, within an IC memory utilizing a low voltage supply, in order to provide a sufficient margin between read and write voltage levels, it may be necessary for an address line buffer to remain operable when buffering address line signals that approach either end of the voltage range of the voltage supply.

SUMMARY

One or more embodiments disclosed within this specification relate to integrated circuits (ICs) and, more particularly, to a system for voltage buffering within an IC. One or more embodiments can include a system for voltage buffering within an IC. The system can include a first buffer having an input and an output. The first buffer can be configured to buffer a received maximum input voltage approximately equal to a positive voltage supply powering the system. The system can include a second buffer having an input and an output. The input of first buffer can be coupled to the input of the second buffer. The output of the first buffer can be coupled to the output of the second buffer. The second buffer can be configured to buffer a received minimum input voltage approximately equal to a negative voltage supply powering the system. The system further can include a controller that is configured to selectively enable only the first buffer or the second buffer at any given time, i.e., at most one of the first and second buffers is enabled.

The controller can be configured to determine whether a voltage of a received mode signal is within a first voltage range or a second voltage range. Responsive to determining that the voltage is within the first voltage range, the controller can enable the first buffer while concurrently disabling the second buffer. Responsive to determining that the voltage is within the second voltage range, the controller can enable the second buffer while concurrently disabling the first buffer.

The system can include a bias generator configured to generate a first bias voltage and a second bias voltage. In addition, the system can include a first switch configured to enable the first buffer by selectively coupling the first bias voltage to the first buffer responsive to a first control signal from the controller. The system further can include a second switch configured to enable the second buffer by selectively coupling the second bias voltage to the second buffer responsive to a second control signal from the controller. In another aspect, the bias generator can be configured to receive a band-gap voltage. The band-gap voltage can be used to generate the first bias voltage and the second bias voltage.

The first buffer can include an input differential pair having a first N-type metal oxide semiconductor (NMOS) device and a second NMOS device. A gate terminal of the first NMOS device can be the input of the first buffer. The first buffer further can include a current source implemented with a third NMOS device having a drain terminal coupled to a source terminal of each of the first and second NMOS devices, a source terminal coupled to the negative voltage supply, and a gate terminal coupled to the first switch. Additionally, the first buffer can include a current mirror implemented with a diode connected first P-type metal oxide semiconductor (PMOS) device having a gate terminal and a drain terminal coupled to a gate terminal of a second PMOS device and a drain terminal of the first NMOS device. A drain terminal of the second PMOS device can be coupled to a drain terminal and a gate terminal of the second NMOS device to form the output of the first buffer.

The second buffer can include an input differential pair having a first PMOS device and a second PMOS device. A gate terminal of the first PMOS device can be the input of the second buffer. The second buffer further can include a current source including a third PMOS device having a drain terminal coupled to a source terminal of each of the first and second PMOS devices, a source terminal coupled to the positive voltage supply, and a gate terminal coupled to the second switch. In addition, the second buffer can include a current mirror implemented with a diode connected first NMOS device having a gate terminal and a drain terminal coupled to a gate terminal of a second NMOS device and a drain terminal of the first PMOS device. A drain terminal of the second NMOS device can be coupled to a drain terminal and a gate terminal of the second PMOS device to form the output of the second buffer.

The first switch can include a transmission gate that, responsive to being enabled, couples the first bias voltage to the gate terminal of the third NMOS device of the first buffer. Additionally, the first switch can include a fourth NMOS device that, responsive to being enabled, couples the gate terminal of the third NMOS device to the negative voltage supply.

The second switch can include a transmission gate that, responsive to being enabled, couples the second bias voltage to the gate terminal of the third PMOS device of the second buffer. Additionally, the second switch can include a fourth PMOS device that, responsive to being enabled, couples the gate terminal of the third PMOS device to the positive voltage supply.

One or more other embodiments can include a circuit for voltage buffering in a complementary metal oxide semiconductor (CMOS) IC. The circuit can include a rail-to-rail buffer. The rail-to-rail buffer can include an NMOS buffer having an NMOS input and an output. The NMOS buffer can be configured to buffer a received maximum input voltage approximately equal to a positive voltage supply powering the circuit. The rail-to-rail buffer further can include a PMOS buffer having a PMOS input and an output. The NMOS input of the NMOS buffer can be coupled to the PMOS input of the PMOS buffer. The output of the NMOS buffer can be coupled to the output of the PMOS buffer. The PMOS buffer can be configured to buffer a received minimum input voltage approximately equal to a negative voltage supply powering the circuit. The rail-to-rail buffer can include a controller configured to selectively enable only the NMOS buffer or the PMOS buffer at any given time.

The circuit also can include a bias generator configured to generate a first bias voltage and a second bias voltage. The circuit can include a first switch configured to enable the NMOS buffer by selectively coupling the first bias voltage to the NMOS buffer responsive to a first control signal from the controller. The circuit further can include a second switch configured to enable the PMOS buffer by selectively coupling the second bias voltage to the PMOS buffer responsive to a second control signal from the controller.

The NMOS buffer can include an input differential pair having a first NMOS device and a second NMOS device. A gate terminal of the first NMOS device can be the NMOS input of the NMOS buffer. The NMOS buffer can include an NMOS current source implemented with a third NMOS device having a drain terminal coupled to a source terminal of each of the first and second NMOS devices, a source terminal coupled to the negative voltage supply, and a gate terminal coupled to the first switch. In addition, the NMOS buffer can include a PMOS current mirror implemented with a diode connected first PMOS device having a gate terminal and a drain terminal coupled to a gate terminal of a second PMOS current source and a drain terminal of the first NMOS device. A drain terminal of the second PMOS device can be coupled to the drain terminal and the gate terminal of the second NMOS device to form the output of the NMOS buffer.

The PMOS buffer can include an input differential pair having a first PMOS device and a second PMOS device. A gate terminal of the first PMOS device can be the PMOS input of the PMOS buffer. The PMOS buffer can include a PMOS current source implemented with a third PMOS device having a drain terminal coupled to a source terminal of each of the first and second PMOS devices, a source terminal coupled to the positive voltage supply, and a gate terminal coupled to the second switch. In addition, the PMOS buffer can include an NMOS current mirror implemented with a diode connected first NMOS device having a gate terminal and a drain terminal coupled to a gate terminal of a second NMOS device and a drain terminal of the first PMOS device. A drain terminal of the second NMOS device can be coupled to the drain terminal and the gate terminal of the second PMOS device to form the output of the PMOS buffer.

The first switch can include a transmission gate that, responsive to being enabled, couples the first bias voltage to the gate terminal of the third NMOS device of the NMOS buffer. Additionally, the first switch can include a fourth NMOS device that, responsive to being enabled, couples the gate terminal of the third NMOS device to the negative voltage supply.

The second switch can include a transmission gate that, responsive to being enabled, couples the second bias voltage to the gate terminal of the third PMOS device of the PMOS buffer. Additionally, the second switch can include a fourth PMOS device that, responsive to being enabled, couples the gate terminal of the third PMOS device to the positive voltage supply.

The bias generator can include a first NMOS device having a gate terminal that receives a reference bias voltage, a source terminal coupled to the negative voltage supply, and a drain terminal that sinks a first bias current. The bias generator further can include a first PMOS device having a drain terminal that sources the first bias current and a gate terminal coupled to a drain terminal of the first NMOS device. The first bias voltage can be generated at the gate terminal of the first PMOS device. The bias generator further can include a second PMOS device having a gate terminal coupled to the gate terminal of the first PMOS device and a drain terminal that sources a second bias current. The second bias current can be approximately equal to the first bias current. In addition, the bias generator can include a second NMOS device having a drain terminal that sinks the second bias current and a gate terminal coupled to a drain terminal of the second PMOS device. The second bias voltage is generated at the gate terminal of the second NMOS device.

One or more other embodiments can include a method of voltage buffering within an IC. The method can include determining whether a voltage of a received mode signal is within one of two different voltage ranges. Responsive to determining that the voltage is in the first voltage range, a first buffer can be enabled while concurrently disabling a second buffer. Responsive to determining that the voltage is in the second voltage range, the second buffer can be enabled while concurrently disabling the first buffer. The first and the second buffers can receive a common input signal and generate a common output signal.

The method further can include buffering a maximum input signal voltage using the first buffer. The maximum input signal voltage can be approximately equal to a positive voltage supply powering the first buffer. The method can include buffering a minimum input signal voltage using the second buffer. The minimum input signal voltage can be approximately equal to a negative voltage supply powering the second buffer.

Enabling a first buffer while concurrently disabling a second buffer can include coupling a first bias voltage to a current source biasing the first buffer and decoupling a second bias voltage from a current source biasing the second buffer. Enabling the second buffer while concurrently disabling the first buffer can include decoupling the first bias voltage from the current source biasing the first buffer and coupling the second bias voltage to the current source biasing the second buffer. In another aspect, the common input voltage received by the first buffer and the second buffer can be the mode signal.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to buffering within an IC. In accordance with one or more embodiments disclosed herein, a system for rail-to-rail voltage buffering is provided that can be implemented within a complementary metal oxide semiconductor (CMOS) IC. The system can include two parallel coupled buffers. A first of the parallel buffers can be implemented to buffer an input signal with a maximum voltage range having an upper end approaching a positive supply rail of the system. A second of the parallel buffers can be implemented to buffer an input signal with a minimum voltage range having a lower end approaching a negative supply rail of the system.

A controller within the system can selectively enable only the first or only the second buffer depending upon whether the input signal to the system is closer to the positive or negative supply rail powering the system. The buffer that is enabled by the controller can be the buffer optimized to process the expected voltage range of the input signal. In this manner, the system can buffer an input signal having a voltage ranging from the positive supply rail to the negative supply rail of the system while only enabling, and dissipating power within, a single buffer at any particular time.

Figure 1:
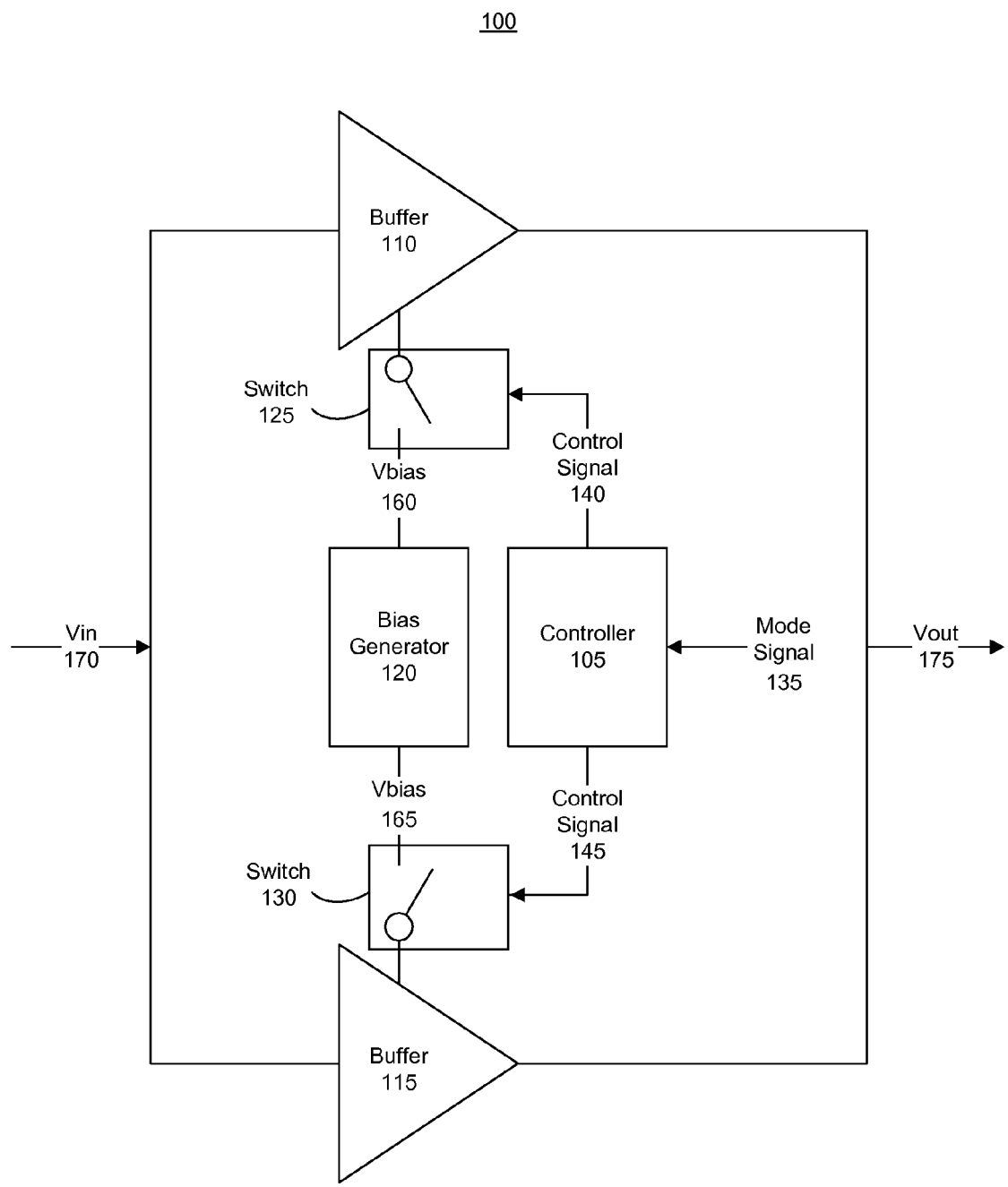
FIG. 1 is a first block diagram illustrating a system for rail-to-rail voltage buffering in accordance with one or more embodiments disclosed within this specification.

FIG. 1 is a first block diagram illustrating a system 100 for rail-to-rail voltage buffering in accordance with one or more embodiments disclosed within this specification. In one aspect, system 100 can be implemented in the form of circuitry within an IC. The circuitry can be implemented, or instantiated, within an IC, whether the IC is a programmable IC or not.

Programmable ICs are a well-known type of IC that can be programmed to perform specified logic functions. Examples of programmable ICs can include, but are not limited to, field programmable gate arrays (FPGAs), complex programmable logic devices (CPLDs), and mask programmable devices. The phrase "programmable IC" refers to fully programmable ICs and also ICs that are only partially programmable. For example, another type of programmable IC includes a combination of hard-coded transistor logic and a programmable switch fabric that programmably interconnects the hard-coded transistor logic.

System 100 can include a controller 105, a buffer 110, a buffer 115, a bias generator 120, a switch 125, and a switch 130. Controller 105 can receive mode signal 135. Responsive to mode signal 135, i.e., the state of mode signal 135, controller 105 can selectively alter system 100 between two operational modes. Controller 105 can alter or change the operational mode of system 100 via control signal 140 and control signal 145 that open or close switches 125 and 130, respectively.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire, as the case may be.

Each of buffers 110 and 115 can include an input and an output. The input of each of buffers 110 and 115 can be coupled together and receive signal Vin 170. The output of each of buffers 110 and 115 can be coupled together and output signal Vout 175. In one or more embodiments, each of buffers 110 and 115 can be implemented with, or in the form of, unity gain amplifiers. Buffer 110 can be implemented with an amplifier architecture that allows buffer 110 to maintain linear operation when buffering signal Vin 170 up to a maximum voltage of approximately the positive supply rail of a voltage supply powering system 100. Buffer 115 can be implemented with an amplifier architecture that allows buffer 115 to maintain linear operation when buffering signal Vin 170 down to a minimum voltage of approximately the negative supply rail of the voltage supply.

Within this specification, the term "supply rail" or "rail," refers to either of a maximum voltage or a minimum voltage provided by a voltage supply on a bus powering an electronic circuit. As such, the phrase "rail-to-rail," when applied to an electronic circuit, refers to the ability of the circuit to operate within predetermined design specifications when receiving or outputting a signal having a voltage range covering the entire voltage range of the voltage supply. For example, a buffer can be powered by a three volt supply. In order to function as a rail-to-rail buffer, the buffer must remain operable when generating or outputting a signal between zero and three volts responsive to receiving an input signal between zero and three volts.

It should be noted that in order for system 100 to function as a rail-to-rail buffer, system 100 must be able to buffer any voltage value of signal Vin 170 that resides within the voltage range of the voltage supply powering system 100. For system 100 to buffer the entire voltage range of the voltage supply, the voltage range of buffer 110 must overlap the voltage range of buffer 115. In that case, in addition to the maximum voltage range of buffer 110 being approximately the positive supply rail and the minimum voltage range of buffer 115 being approximately the negative supply rail, the minimum voltage range of buffer 110 must be less than the maximum voltage range of buffer 115, thus providing range overlap. Buffer 110 is coupled to switch 125. Buffer 115 is coupled to switch 130.

Bias generator 120 can generate two bias voltages. Each bias voltage can be used to bias one of buffers 110 and 115 to a predetermined level of current biasing. The first bias voltage, denoted as Vbias 160 in FIG. 1, is coupled to switch 125. The second bias voltage, denoted as Vbias 165, is coupled to switch 130.

Switch 125 is illustrated within FIG. 1 as a functional representation of a device that is configured to selectively couple Vbias 160 to buffer 110. Switch 125 is coupled to controller 105 via control signal 140. Via control signal 140, controller 105 can selectively enable, e.g., close, switch 125. Switch 130 is illustrated as a functional representation of a device that is configured to selectively couple Vbias 165 to buffer 115. Switch 130 is coupled to controller 105 via control signal 145. Via control signal 145, controller 105 can selectively enable switch 130.

In operation, beginning with system 100 powered on and fully operational, controller 105 can monitor mode signal 135. Responsive to a change in the logic state of mode signal 135, controller 105 can determine the present state of mode signal 135, e.g., being high or low, and invoke one of two operational modes within system 100 responsive to the state determination. When invoked, each of the two operational modes insures full functionality of system 100 when the voltage range of signal Vin 170 approaches one of two supply rails powering system 100.

One operational mode, e.g., a first operational mode, can be configured to optimize the performance of system 100 when operating with signals approaching the positive supply rail of system 100. The other operational mode, e.g., a second operational mode, can be configured to optimize the performance of system 100 when operating with signals approaching the negative supply rail of system 100.

Each operational mode can be invoked by controller 105 to selectively enable one of buffers 110 or 115. Controller 105 can enable the first operational mode, via control signal 140, by enabling switch 125. When enabled, switch 125 can couple Vbias 160 to buffer 110. When applied to buffer 110, Vbias 160 can induce a predetermined level of bias current within buffer 110 that enables buffer 110. The predetermined level of bias current can be implemented to provide a specified level of current driving capability to buffer 110. Simultaneously, controller 105 can disable switch 130 via control signal 145. With switch 130 disabled, Vbias 165 is decoupled from buffer 115, thereby disabling buffer 115. With buffer 110 enabled, system 100 is optimized to operate with signal ranges of signals Vin 170 and Vout 175 that approach the positive supply rail of system 100.

Controller 105 can enable the second operational mode, via control signal 145, by enabling switch 130. When enabled, switch 130 can couple Vbias 165 to buffer 115. When applied to buffer 115, Vbias 165 can induce a predetermined level of bias current within buffer 115 that enables buffer 115. The predetermined level of bias current can be implemented to provide a specified level of current driving capability to buffer 115. Simultaneously, controller 105 can disable switch 125 via control signal 140. With switch 125 disabled, Vbias 160 is decoupled from buffer 110 and buffer 110 is disabled. With only buffer 115 enabled, system 100 is optimized to operate with signal ranges for signals Vin 170 and Vout 175 that approach the negative supply rail of system 100.

The amount of current driving capability required for buffers 110 and 115 can depend upon a size of a load, typically capacitive, coupled to buffers 110 and 115. In addition, the current driving capability required for buffers 110 and 115 can depend upon performance parameters such as slew rate, rise time, switching speed, or the like for signal Vout 175.

In illustration, system 100 can be powered by a three volt supply. System 100 can be implemented within a larger system in which signal Vin 170 can be received from two distinct sources (not shown) operating with two differing voltage ranges. The outputs of the two sources can be multiplexed and the source of signal Vin 170 can be selectively switched between the two sources. A first source can output a signal that varies from approximately 1.5-3.0 volts. A second source can output a signal that varies from approximately 0-1.5 volts. As such, depending upon the source of signal Vin 170, signal Vin 170 can vary between approximately 0 and 3.0 V.

When the first source provides signal Vin 170, mode signal 135 can be in a logic state that directs controller 105 to place system 100 in the first operational mode, thereby enabling buffer 110 and disabling buffer 115. Buffer 110, being implemented to buffer signals approaching the three volt supply rail of system 100, can accurately buffer the entire 1.5-3.0 V voltage range of signal Vin 170 when provided by the first source.

When the second source provides signal Vin 170, mode signal 135 can transition to a logic state that directs controller 105 to place system 100 in the second operational mode, thereby enabling buffer 115 and disabling buffer 110. Buffer 115, being implemented to buffer signals approaching the zero volt supply rail of system 100, can accurately buffer the entire 0-1.5 V voltage range of signal Vin 170 when provided by the second source.

By switching between the first and second operational modes, only one of buffers 110 and 115 is enabled and consuming power at any given time. Each operational mode can be selectively enabled, via mode signal 135, depending upon the expected voltage range of signal Vin 170. Accordingly, system 100 can buffer signal Vin 170 over the entire rail-to-rail voltage range of system 100 while only consuming power within one of buffers 110 and 115. The ability of system 100 to operate over the entire voltage range of the voltage supply powering system 100 while only consuming power in a single buffer can be beneficial when implemented within low power and/or low voltage applications.

Figure 2:
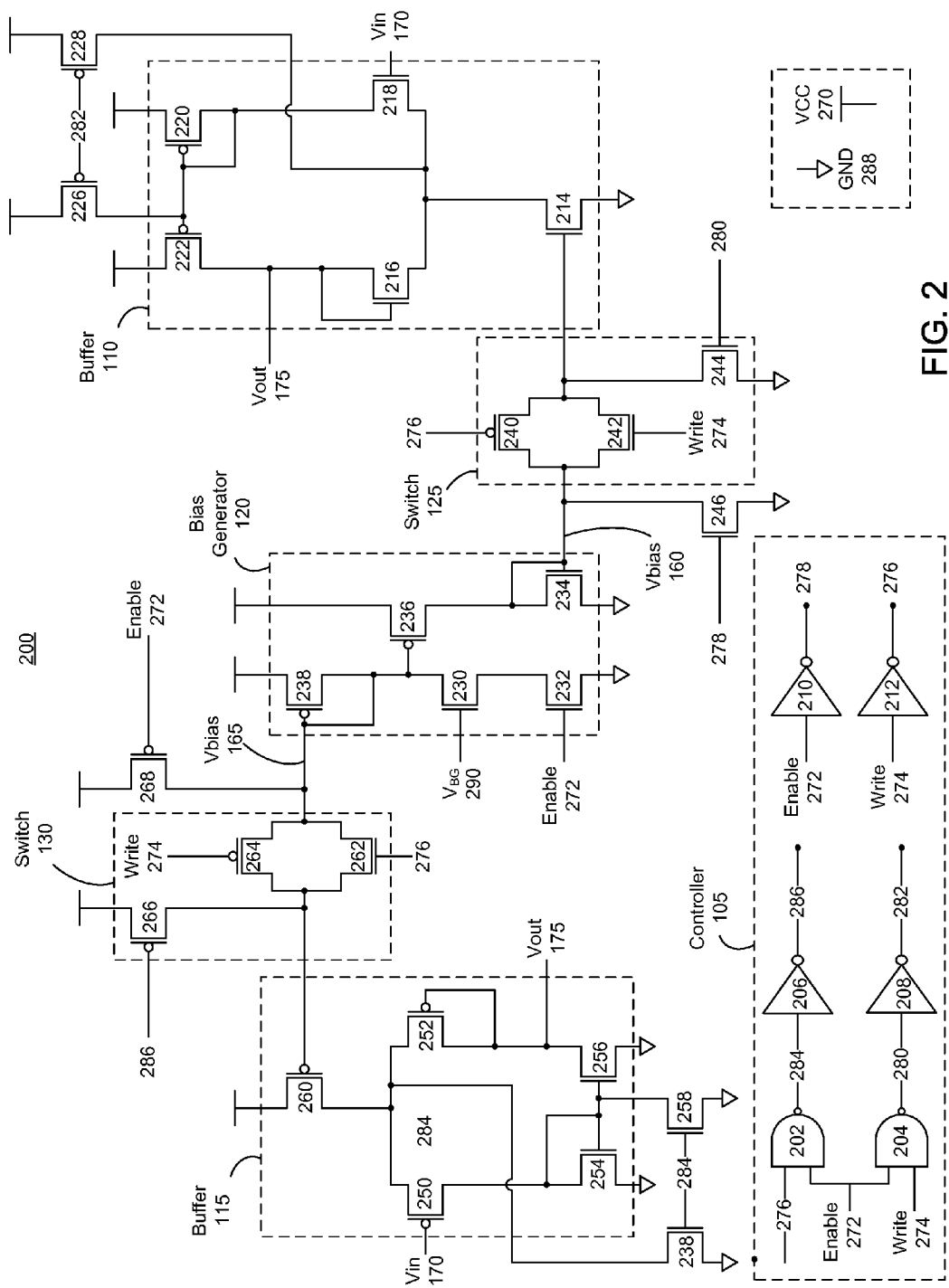
FIG. 2 is a second block diagram illustrating a circuit for rail-to-rail voltage buffering in accordance with one or more other embodiments disclosed within this specification.

FIG. 2 is a second block diagram illustrating a circuit 200 for rail-to-rail voltage buffering in accordance with one or more other embodiments disclosed within this specification. Circuit 200 can be implemented using a system as described with reference to FIG. 1. As such, like numbers will be used to refer to the same items throughout this specification to the extent possible. Circuit 200 can illustrate a rail-to-rail voltage buffer as implemented within a CMOS IC. In one or more embodiments, circuit 200 can be implemented as an address line buffer for use within a low voltage IC memory block.

Within IC memory, during a data operation, e.g., a read or a write, a voltage potential is applied to an address line. The voltage potential applied to the address line can vary depending upon whether a read or a write operation is performed. In the case of an IC memory powered by a low voltage supply, the margin between the voltage level for a read operation and the voltage level for a write operation can be minimal. To create sufficient margin between the read and the write voltage levels, each voltage level can be shifted closer to an opposing supply rail in order to increase the separation between the two voltage levels. In order to implement read and write voltage levels with each approaching an opposing supply rail, an address line buffer driving the address line must be capable of operating over the entire voltage range of the voltage supply.

Conventionally, address line buffers are implemented with a unity gain amplifier architecture including a P-type metal oxide semiconductor (PMOS) input and a PMOS tail current source. The PMOS amplifier architecture limits the input voltage range of the buffer as sufficient voltage margin is required between the amplifier input voltage and the positive supply rail to enable the PMOS input device and retain the PMOS current source in saturation or active mode. As such, the maximum input and output voltage for the PMOS amplifier is limited to the voltage at the positive supply rail minus the sum of (1) the threshold voltage of the input PMOS device and (2) sufficient voltage across the drain to source terminal of the PMOS current source to keep the PMOS current source in saturation mode.

In illustration, consider the case in which a 1.7 volt supply powers an IC. A unity gain buffer with PMOS inputs and PMOS current source can be implemented within the IC. Typically, the threshold voltage for PMOS input devices in a modern IC manufacturing process is approximately 0.6+/−1-0.2 volts. In addition, the PMOS current source generally requires approximately 200 mV or more of drain to source voltage in order to remain in the saturation mode of operation. As such, the voltages required at the input of the PMOS amplifier to assure proper operation when combined are approximately 0.8 volts, i.e., 0.6 volts+0.2 volts. With the 1.7 volt supply, the amplifier then has approximately 0.9 volts of margin to distinguish a read voltage from a write voltage at the address line.

In order to increase the signal voltage range at which circuit 200 can operate, circuit 200 is implemented with two distinct buffers. Each buffer can be optimized to buffer an input signal range approaching one of the supply rails of circuit 200. Buffer 110 is implemented to buffer a maximum input signal approximately equal to the positive supply rail. Buffer 110 can include N-type metal oxide semiconductor devices (NMOS) 214, 216, and 218, and PMOS devices (PMOS) 220 and 222. NMOS 216 and 218 form an input differential pair. NMOS 214 serves as a current source that provides bias current to buffer 110. The source terminal of each of NMOSs 216 and 218 is coupled to a drain terminal of NMOS 214. NMOS 214 is coupled to GND 288 that sinks any bias current sourced from NMOS 214. The drain and gate terminals of PMOS 220 can be coupled together in a diode configuration and coupled to the drain terminal of NMOS 218. The gate terminal of PMOS 222 can be coupled to the gate terminal of PMOS 220.

The drain terminal of PMOS 222 is coupled to the drain terminal of NMOS 216. Configured in this manner, PMOSs 220 and 222 serve as a current mirror active load that when sourcing current to inputs NMOSs 216 and 218 determines the output voltage swing of buffer 110, i.e., signal Vout 175. It should be noted that with PMOSs 220 and 222 implemented as a current mirror, currents generated within PMOS 220 are mirrored or "folded over" to PMOS 222. The source terminal of each of PMOSs 220 and 222 is coupled to a voltage supply VCC 270 that powers circuit 200. The gate terminal of NMOS 216, the inverting input of the input differential pair of buffer 110 formed by NMOSs 216 and 218, is coupled to the drain terminals of NMOS 216 and PMOS 222 to form the output of buffer 110 that generates signal Vout 175.

Throughout this specification reference is made to various voltage sources to which components of circuit 200 can be coupled. As such, each voltage source can represent a node to which a component can be coupled as well as a particular voltage potential associated with that node. For example, the source terminal of PMOS 222 is coupled to voltage source VCC 270. Being coupled to VCC 270, the voltage of VCC is present at the source terminal of PMOS 222. Thus, when referring to a node or supply rail, reference numbers will be used. When referring to a voltage, the symbol, e.g., VCC or GND, generally will be used unaccompanied by the reference numbers. Similarly, a circuit whose output voltage range is limited to the voltage of the voltage sources powering the circuit can be said to vary between the voltages associated with each voltage source powering the circuit. For example, circuit 200 is coupled to, and powered by, voltage sources VCC 270 and GND 288. Being powered by voltage sources VCC 270 and GND 288, the voltage range of an output signal from circuit 200 can be referred to generally as varying between VCC and GND.

The signal pathway from the gate terminal through the drain terminal and back to the gate terminal of NMOS 216 forms a unity gain negative feedback loop within buffer 110. The unity gain negative feedback loop fixes the gain of buffer 100 at unity. Signal Vin 170, the input signal to buffer 110, is applied at the gate terminal of NMOS 218. The output signal Vout 175 is generated at the coupling point between the drain terminals of NMOS 216 and PMOS 222. As such, buffer 110 implements a unity gain, single ended input, single ended output, amplifier. Buffer 110, being implemented with a complementary architecture as compared to the conventional PMOS address line buffer described previously, allows the voltage range of signal Vin 170 to approach VCC without impacting the linear operation of buffer 110. However, the minimum input and output voltage for the PMOS amplifier is limited to the voltage at the negative supply rail, i.e., GND, plus the threshold voltage of the input NMOS 218 and the drain to source voltage required to keep current source NMOS 214 in the saturation mode of operation.

Buffer 115 is implemented to buffer a minimum input signal approximately equal to the negative supply rail. Buffer 115 implements the analogous complementary PMOS architecture to the NMOS architecture of buffer 110. PMOSs 250 and 252 implement the input differential pair of buffer 115. PMOS 260 implements the current source that sources bias current to buffer 115. NMOSs 254 and 256 implement the current mirror active load for buffer 115. The gate terminal of PMOS 250 is coupled to the gate terminal of NMOS 218 within buffer 110 and receives signal Vin 170. The drain terminals of NMOS 256 and PMOS 252 are coupled to the drain terminals of NMOS 216 and PMOS 222 of buffer 110 and, as such, generate output signal Vout 175.

The gate terminal of each of current sources NMOS 214 and PMOS 260 can receive a bias voltage from bias generator 120. Bias generator 120 can include NMOSs 230, 232, and 234, and PMOSs 236 and 238. Bias generator 120 can receive a stable reference voltage $V_{BG}$ 290. In one or more embodiments, $V_{BG}$ 290 can be a temperature independent band-gap voltage generated within the IC in which circuit 200 is implemented and provided to bias generator 120. A "band-gap voltage" generally refers to a reference voltage that is relatively stable as the temperature of the IC in which the band-gap voltage is generated varies. For example, the temperature independence of the band-gap voltage can be created by offsetting the temperature coefficient of a transistor, which is complementary to absolute temperature, with a current that is proportional to absolute temperature.

A gate terminal of NMOS 232 can receive enable signal 272, denoted as enable 272 in FIG. 2. Enable signal 272 can be a control signal provided to circuit 200 that is used to switch circuit 200 between an enabled state and a power down state.

In describing bias generator 120, it is assumed that circuit 200 is enabled and enable signal 272 is at a logic high. With enable signal 272 at a logic high, a voltage of approximately VCC is applied to the gate terminal of NMOS 232. Enabling NMOS 232 couples the source terminal of NMOS 230 to GND 288. As such, the gate to source voltage across NMOS 230 is approximately $V_{BG}$.

Depending upon the sizing of NMOS 230, a predetermined current is generated within NMOS 230 by the application of $V_{BG}$ 290. As the gate and drain terminals of PMOS 238 are coupled, PMOS device 238 implements a diode and, as such, the current sunk by NMOS 230 is sourced through PMOS 238. The voltage Vbias 165, generated at the gate terminal of PMOS 238, serves as a bias voltage for the current source PMOS 260 of buffer 115. In addition, as the gate terminals of PMOSs 236 and 238 are coupled and the source terminals of PMOSs 236 and 238 are coupled to VCC 270, the gate to source voltage applied across each of PMOSs 236 and 238 is approximately the same. In that case, the current flowing through PMOS 236 is proportional to the current flowing through PMOS 238. As the gate and drain terminals of NMOS 234 are coupled, NMOS 234 implements a diode and, as such, the current sourced by PMOS 236 is sunk through NMOS 234. The voltage Vbias 160, generated at the gate terminal of NMOS 234, serves as a bias voltage for current source NMOS 214 of buffer 110.

The gate terminal of NMOS 234 is coupled to switch 125. Switch 125 can include PMOS 240, and NMOSs 242 and 244. PMOS 240 and NMOS 242 can form a transmission gate structure whose gate terminals are coupled to write_bar signal 276, denoted as simply 276 in FIG. 2 and write signal 274, denoted as write 274 in FIG. 2 respectively. Write signal 274 serves as a control signal that alters the operation mode of circuit 200 depending upon whether the address line being buffered by circuit 200 is undergoing a read or a write operation. Write_bar signal 276 is a logic inversion of write signal 274. When write signal 274 is a logic high, switch 125 is enabled and Vbias 160 is coupled to the gate terminal of NMOS 214. Accordingly, a bias current is generated within NMOS 214 that biases buffer 110.

The gate terminal of PMOS 238 is coupled to switch 130. Switch 130 can include NMOS 262, and PMOSs 264 and 266. PMOS 264 and NMOS 262 can form a transmission gate structure whose gate terminals are coupled to write signal 274 and write_bar signal 276, respectively. When write signal 274 is a logic low, switch 130 is enabled and Vbias 165 is coupled to the gate terminal of PMOS 260. Accordingly, a bias current is generated within PMOS 260 that biases buffer 115.

In one or more embodiments, the body of each PMOS device can be coupled to VCC 270 and the body of each NMOS device can be coupled to GND 288 within circuit 200. Typically, VCC 270 represents a highest voltage potential available within an IC in which circuit 200 is implemented. Similarly, GND 288 represents a lowest voltage potential available within the IC in which circuit 200 is implemented. It should be noted that although circuit 200 is implemented with CMOS devices, circuit 200 can be implemented within other IC manufacturing processes using analogous transistor devices. As such, the implementation of circuit 200 with CMOS devices is not intended to be limiting, but rather to provide an understandable description of the one or more embodiments disclosed herein. For example, circuit 200 can be implemented within a bipolar transistor process substituting NPN and PNP transistors for NMOS and PMOS transistors, respectively.

In one or more embodiments, the function of controller 105 can be increased in complexity such that mode signal 135, as referenced in FIG. 1, is implemented to control circuit 200 based upon a logical combination of an enable signal, e.g., enable signal 272, as well as a mode signal, e.g., write signal 274. Implemented in this manner, controller 105 can direct the enabling of circuit 200 in concert with the operational mode control functionality previously described within this specification.

Enable signal 272 can represent a control signal that alters circuit 200 between a powered up, e.g., an operational state, and a powered down, e.g., a disabled state. When placed in the powered down state by enable signal 272, the power dissipated by circuit 200 is negligible. Write signal 274 can represent a control signal that switches circuit 200 between two operational modes depending upon whether a read or a write operation is being invoked upon an address line buffered by circuit 200. Controller 105 can include NAND gates 202 and 204 as well as inverters 206, 208, 210, and 212.

Inverters 210 and 212 can receive enable signal 272 and write signal 274, respectively, and generate enable_bar signal 278, denoted as 278 in FIG. 2 and write_bar signal 276, at their outputs. Each of NMOSs 232, 246, and PMOS 268 can be used to implement a power down function for bias generator 120. With enable 272 at a logic low and, accordingly, enable_bar signal 278 at a logic high, NMOS 246 and PMOS 268 are enabled and NMOS 232 is disabled. The disabling of NMOS 232 decouples the source terminal of NMOS 230 from GND 288, thereby breaking the current path through NMOS 230.

In addition, enabling PMOS 268 couples the gate terminal of PMOS 238 to VCC 270. With the gate terminal of PMOS 238 coupled to VCC 270, PMOS 238 is disabled and no current flows though PMOS 238. Similarly, enabling NMOS 246 couples the gate terminal of NMOS 234 to GND 288. With gate terminal of NMOS 234 coupled to GND 288, NMOS 234 is disabled and no current flows though NMOS 234. As no current flows through NMOSs 230, 234, and PMOS 238, bias generator 120 is disabled and dissipates no power.

Continuing with controller 105, NANDs 202, 204, inverters 206 and 208, in combination, generate signals 280, 282, 284, and 286 that control dual enable and mode functions within circuit 200. Signals 280-286 control blocks within circuit 200 that are enabled and disabled as a function of both the operation mode and the power enable state of circuit 200. For example, within switch 125, signal 280 controls the enabling of NMOS 244 that couples the gate terminal of NMOS 214 to GND 288, thereby assuring no current flows though NMOS 214 when buffer 110 is disabled. Signal 280 is the output of NAND 204 that receives both enable signal 272 and write signal 274 as inputs. This logic combination of enable signal 272 and write signal 274 results in signal 280 being a logic high and NMOS 244 disabling buffer 110 whenever either of enable signals 272 and write signal 274 is at a logic low. As a result, buffer 110 is powered down whenever circuit 200 is to be powered down and/or circuit 200 is to be optimized to buffer input signals close to the negative supply rail of circuit 200.

Similarly, within switch 130, signal 286 controls the enabling of PMOS 266 that couples the gate terminal of PMOS 260 to VCC 270, thereby assuring no current flows though PMOS 260. Signal 286 is the output of inverter 206 coupled in series to NAND 202 that receives enable signal 272 and write_bar signal 276 as inputs. This logic combination of enable signal 272 and write_bar signal 276 results in signal 286 disabling buffer 115 whenever either of enable signal 272 or write_bar signal 276 is at a logic low. As a result, buffer 115 is powered down whenever circuit 200 is to be powered down and/or circuit 200 is to be optimized to buffer input signals close to the positive supply rail of circuit 200.

Additionally, controller 105 controls the enabling of PMOSs 226 and 228 within buffer 110 and NMOSs 238 and 258 within buffer 115. The gate terminal of each of PMOSs 226 and 228 receives signal 282 from controller 105. Each of PMOSs 226 and 228 are enabled when signal 282 is at a logic low. Signal 282, being the logic inversion of signal 280, results in signal 282 being at a logic low whenever either of enable signal 272 or write signal 274 is at a logic low. As a result, PMOSs 226 and 228 are enabled whenever either of enable signal 272 or write signal 274 is at a logic low. The enabling of PMOSs 226 and 228 assures no CMOS devices within buffer 110 are inadvertently enabled and no unintended current paths exist within buffer 110 that dissipate power when buffer 110 is disabled.

The gate terminal of each of NMOSs 238 and 258 receives control signal 284 from controller 105. NMOSs 238 and 258 are enabled when signal 284 is at a logic high. Signal 284 is the output of NAND 202 that receives both enable signal 272 and write_bar signal 276 as inputs. This logic combination of enable signal 272 and write_bar signal 276 results in signal 284 being a logic high and NMOSs 238 and 258 being enabled whenever either of enable signals 272 or write signal 274 is at a logic low. The enabling of NMOSs 238 and 258 can assure that no CMOS devices are inadvertently enabled and no unintended current paths exist within buffer 115 that dissipate power when buffer 115 is disabled.

It should be noted that when enable signal 272 is a logic low, each of buffer 110, buffer 115, and bias generator 120 is disabled. In addition, PMOSs 226, 228, and 268 and NMOSs 238, 246, and 258 are enabled, thereby assuring that no unintended current paths exist though which current can flow within circuit 200. In this manner, via enable signal 272, circuit 200 can be placed in a disabled power down state that dissipates a negligible amount of power.

Figure 3:
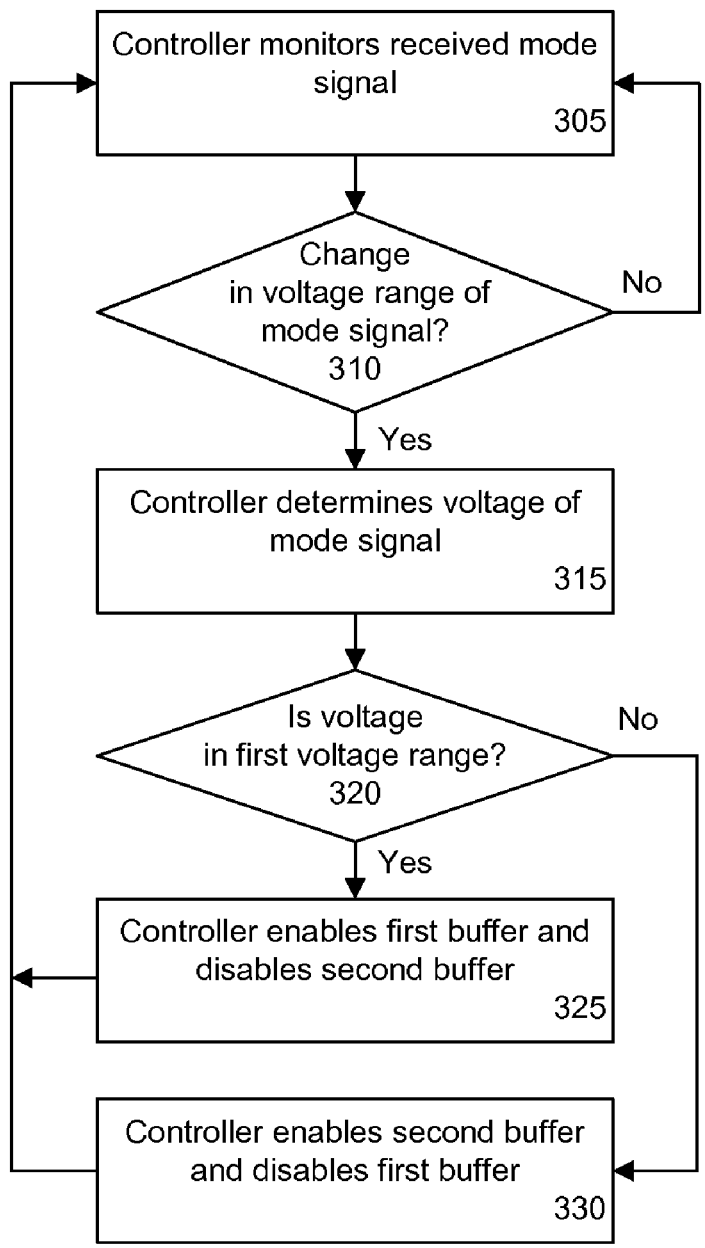
FIG. 3 is a flow chart illustrating a method of rail-to-rail voltage buffering in accordance with one or more other embodiments disclosed within this specification.

FIG. 3 is a flow chart illustrating a method 300 of rail-to-rail voltage buffering in accordance with one or more other embodiments disclosed within this specification. Method 300 can be implemented using a system as described with reference to FIGS. 1 and 2. In general, method 300 describes a method of voltage buffering an input signal operating within two differing voltage ranges, where each voltage range approaches an opposite end of a voltage supply powering the system. Method 300 illustrates a method of operation for the controller illustrated with reference to FIGS. 1 and 2.

Beginning in step 305, the controller, being configured to receive a mode signal, can monitor the mode signal. In decision box 310, the controller can determine whether a change occurred in a voltage range of the mode signal, e.g., a change in logic state. In one or more embodiments, the controller can monitor an input signal to the system as the mode signal. In one or more other embodiments, a threshold voltage can be established that, when crossed, indicates that a change in the voltage range of the mode signal has occurred. When the controller determines that a change of voltage range has occurred in the mode signal, method 300 can proceed to step 315. When the controller determines that no change of voltage range has occurred in the input signal, method 300 can return to step 305 and continue monitoring for a change in the voltage range of the mode signal.

In step 315, the controller can determine a voltage of the mode signal. In decision box 320, the controller can determine whether the mode signal is in a first voltage range. When the controller determines that the mode signal is in the first voltage range, method 300 can proceed to step 325. When the controller determines that the mode signal is not in the first voltage range, the controller determines, e.g., by default, that the mode signal is in a second voltage range. Accordingly, method 300 can proceed to step 330.

In step 325, the controller can place the system in a first operational mode by enabling a first buffer within the system and disabling a second buffer within the system. The inputs of the first and second buffer can be coupled and receive a same input signal. Similarly the output of the first and second buffers can be coupled and generate a same output signal. The enabled first buffer can be optimized to buffer input signals with voltages ranging up to the positive supply rail powering the system. Following step 325, method 300 can return to step 305 and continue to monitor the input signal for changes in voltage range.

In step 330, the controller can place the system in the second operational mode by enabling the second buffer and disabling the first buffer. The enabled second buffer can be implemented to buffer input signals with voltages ranging down to the negative supply rail powering the system. Following step 330, method 300 can return to step 305 and continue to monitor the mode signal for changes in voltage range.

The one or more embodiments disclosed within this specification provide an efficient line buffering system that can be utilized in low power, low voltage IC applications, and, in particular, low voltage IC memory applications. Two buffers, where each is optimized for operation in a particular voltage range, can be used. A controller can selectively enable one of the two buffers at a time based upon the voltage range of a control signal to the controller. The control signal can be logic based, and as such, provide the ability to selectively switch the system between two operational states. Alternatively, the control signal can be the input signal to the buffering system, thereby allowing the system to actively optimize the operational mode of the system according to the input voltage received. In any case, the operating range of the system can be extended and optimized while limiting the power consumption of the system.

The flowcharts in the figures illustrate the architecture, functionality, and operation of possible implementations of systems and methods. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A system for voltage buffering within an integrated circuit (IC), the system comprising:
    a first buffer comprising an input and an output, wherein the first buffer is configured to buffer a received maximum input voltage approximately equal to a positive voltage supply powering the system;
    a second buffer comprising an input and an output, wherein the input of the first buffer is coupled to the input of the second buffer, wherein the output of the first buffer is coupled to the output of the second buffer, and wherein the second buffer is configured to buffer a received minimum input voltage approximately equal to a negative voltage supply powering the system;
    a controller configured to selectively enable only the first buffer or the second buffer at any given time;
    a bias generator configured to generate a first bias voltage and a second bias voltage;
    a first switch configured to enable the first buffer by selectively coupling the first bias voltage to the first buffer responsive to a first control signal from the controller; and
    a second switch configured to enable the second buffer by selectively coupling the second bias voltage to the second buffer responsive to a second control signal from the controller.

2. The system of claim 1, wherein:
    the controller is further configured to determine whether a voltage of a received mode signal is within a first voltage range or a second voltage range;
    responsive to determining that the voltage is within the first voltage range, the controller enables the first buffer while concurrently disabling the second buffer; and
    responsive to determining that the voltage is within the second voltage range, the controller enables the second buffer while concurrently disabling the first buffer.

3. The method of claim 1, wherein the bias generator is further configured to receive a band-gap voltage, wherein the band-gap voltage is used to generate the first bias voltage and the second bias voltage.

4. The system of claim 1, wherein the first buffer comprises:
    an input differential pair comprising a first N-type metal oxide semiconductor (NMOS) device and a second NMOS device, wherein a gate terminal of the first NMOS device is the input of the first buffer;
    a current source comprising a third NMOS device comprising a drain terminal coupled to a source terminal of each of the first and second NMOS devices, a source terminal coupled to the negative voltage supply, and a gate terminal coupled to the first switch; and
    a current mirror comprising a diode connected first P-type metal oxide semiconductor (PMOS) device comprising a gate terminal and a drain terminal coupled to a gate terminal of a second PMOS device and a drain terminal of the first NMOS device, wherein a drain terminal of the second PMOS device is coupled to a drain terminal and a gate terminal of the second NMOS device to form the output of the first buffer.

5. The system of claim 4, wherein the first switch comprises:
    a transmission gate that, responsive to being enabled, couples the first bias voltage to the gate terminal of the third NMOS device of the first buffer; and
    a fourth NMOS device that, responsive to being enabled, couples the gate terminal of the third NMOS device to the negative voltage supply.

6. The system of claim 1, wherein the second buffer comprises:
    an input differential pair comprising a first P-type metal oxide semiconductor (PMOS) device and a second PMOS device, wherein a gate terminal of the first PMOS device is the input of the second buffer;
    a current source comprising a third PMOS device comprising a drain terminal coupled to a source terminal of each of the first and second PMOS devices, a source terminal coupled to the positive voltage supply, and a gate terminal coupled to the second switch; and
    a current mirror comprising a diode connected first N-type metal oxide semiconductor (NMOS) device comprising a gate terminal and a drain terminal coupled to a gate terminal of a second NMOS device and a drain terminal of the first PMOS device, wherein a drain terminal of the second NMOS device is coupled to a drain terminal and a gate terminal of the second PMOS device to form the output of the second buffer.

7. The system of claim 6, wherein the second switch comprises:
    a transmission gate that, responsive to being enabled, couples the second bias voltage to the gate terminal of the third PMOS device of the second buffer; and
    a fourth PMOS device that, responsive to being enabled, couples the gate terminal of the third PMOS device to the positive voltage supply.

8. A circuit for voltage buffering in a complementary metal oxide semiconductor (CMOS) integrated circuit (IC), the circuit comprising:
    a rail-to-rail buffer comprising:
        an N-type metal oxide semiconductor (NMOS) buffer comprising an NMOS input and an output, wherein the NMOS buffer is configured to buffer a received maximum input voltage approximately equal to a positive voltage supply powering the circuit, and
        a P-type metal oxide semiconductor (PMOS) buffer comprising a PMOS input and an output, wherein the NMOS input of the NMOS buffer is coupled to the PMOS input of the PMOS buffer, wherein the output of the NMOS buffer is coupled to the output of the PMOS buffer, and wherein the PMOS buffer is configured to buffer a received minimum input voltage approximately equal to a negative voltage supply powering the circuit;
    a controller configured to selectively enable only the NMOS buffer or the PMOS buffer at any given time;
    a bias generator configured to generate a first bias voltage and a second bias voltage;
    a first switch configured to enable the NMOS buffer by selectively coupling the first bias voltage to the NMOS buffer responsive to a first control signal from the controller; and a second switch configured to enable the PMOS buffer by selectively coupling the second bias voltage to the PMOS buffer responsive to a second control signal from the controller.

9. The circuit of claim 8, wherein the NMOS buffer further comprises:
an input differential pair comprising a first NMOS device and a second NMOS device, wherein a gate terminal of the first NMOS device is the NMOS input of the NMOS buffer;
an NMOS current source comprising a third NMOS device comprising a drain terminal coupled to a source terminal of each of the first and second NMOS devices, a source terminal coupled to the negative voltage supply, and a gate terminal coupled to the first switch; and
a PMOS current mirror comprising a diode connected first PMOS device comprising a gate terminal and a drain terminal coupled to a gate terminal of a second PMOS current source and a drain terminal of the first NMOS device, and wherein a drain terminal of the second PMOS device is coupled to the drain terminal and the gate terminal of the second NMOS device to form the output of the NMOS buffer.

10. The circuit of claim 9, wherein the first switch comprises:
a transmission gate that, responsive to being enabled, couples the first bias voltage to the gate terminal of the third NMOS device of the NMOS buffer; and
a fourth NMOS device that, responsive to being enabled, couples the gate terminal of the third NMOS device to the negative voltage supply.

11. The circuit of claim 8, wherein the PMOS buffer further comprises:
an input differential pair comprising a first PMOS device and a second PMOS device, wherein a gate terminal of the first PMOS device is the PMOS input of the PMOS buffer;
a PMOS current source comprising a third PMOS device comprising a drain terminal coupled to a source terminal of each of the first and second PMOS devices, a source terminal coupled to the positive voltage supply, and a gate terminal coupled to the second switch; and
an NMOS current mirror comprising a diode connected first NMOS device comprising a gate terminal and a drain terminal coupled to a gate terminal of a second NMOS device and a drain terminal of the first PMOS device, and wherein a drain terminal of the second NMOS device is coupled to the drain terminal and the gate terminal of the second PMOS device to form the output of the PMOS buffer.

12. The circuit of claim 11, wherein the second switch comprises:
a transmission gate that, responsive to being enabled, couples the second bias voltage to the gate terminal of the third PMOS device of the PMOS buffer; and
a fourth PMOS device that, responsive to being enabled, couples the gate terminal of the third PMOS device to the positive voltage supply.

13. The circuit of claim 8, wherein the bias generator comprises:
a first NMOS device comprising a gate terminal that receives a reference bias voltage, a source terminal coupled to the negative voltage supply, and a drain terminal that sinks a first bias current;
a first PMOS device comprising a drain terminal that sources the first bias current and a gate terminal coupled to a drain terminal of the first NMOS device, wherein the first bias voltage is generated at the gate terminal of the first PMOS device;
a second PMOS device comprising a gate terminal coupled to the gate terminal of the first PMOS device and a drain terminal that sources a second bias current, wherein the second bias current is approximately equal to the first bias current; and
a second NMOS device comprising a drain terminal that sinks the second bias current and a gate terminal coupled to a drain terminal of the second PMOS device, wherein the second bias voltage is generated at the gate terminal of the second NMOS device.

14. A method of voltage buffering within an integrated circuit (IC), the method comprising:
determining whether a voltage of a received mode signal is within one of two different voltage ranges;
responsive to determining that the voltage is in the first voltage range, enabling a first buffer while concurrently disabling a second buffer; and
responsive to determining that the voltage is in the second voltage range, enabling the second buffer while concurrently disabling the first buffer,
wherein the first and the second buffers receive the mode signal as a common input signal and generate a common output signal; and
wherein enabling the first buffer while concurrently disabling the second buffer comprises:
coupling a first bias voltage to a current source biasing the first buffer; and
decoupling a second bias voltage from a current source biasing the second buffer.

15. The method of claim 14, further comprising:
buffering a maximum input signal voltage using the first buffer, wherein the maximum input signal voltage is approximately equal to a positive voltage supply powering the first buffer; and
buffering a minimum input signal voltage using the second buffer, wherein the minimum input signal voltage is approximately equal to a negative voltage supply powering the second buffer.

16. The method of claim 14, wherein enabling the second buffer while concurrently disabling the first buffer comprises:
decoupling the first bias voltage from the current source biasing the first buffer; and
coupling the second bias voltage to the current source biasing the second buffer.

* * * * *